United States Patent
Zamani et al.

(10) Patent No.: US 12,470,186 B2
(45) Date of Patent: Nov. 11, 2025

(54) HIGH IMPEDANCE AND COMPACT NEURAL SENSOR FRONT-END

(71) Applicant: AARHUS UNIVERSITET, Aarhus C (DK)

(72) Inventors: Milad Zamani, Risskov (DK); Amin Rashidi, ZG Delft (NL); Farshad Moradi, Risskov (DK)

(73) Assignee: AARHUS UNIVERSITET, Aarhus C (DK)

( * ) Notice: Subject to any disclaimer, the term of this patent is extended or adjusted under 35 U.S.C. 154(b) by 440 days.

(21) Appl. No.: 18/023,630

(22) PCT Filed: Sep. 1, 2021

(86) PCT No.: PCT/EP2021/074101
§ 371 (c)(1),
(2) Date: Feb. 27, 2023

(87) PCT Pub. No.: WO2022/049108
PCT Pub. Date: Mar. 10, 2022

(65) Prior Publication Data
US 2023/0318549 A1    Oct. 5, 2023

(30) Foreign Application Priority Data

Sep. 1, 2020    (EP) .................................... 20193853

(51) Int. Cl.
*H03F 3/45*    (2006.01)
*H03F 1/56*    (2006.01)
(Continued)

(52) U.S. Cl.
CPC ............ *H03F 3/387* (2013.01); *H03F 1/56* (2013.01); *A61B 5/279* (2021.01); *A61B 5/7203* (2013.01);
(Continued)

(58) Field of Classification Search
CPC ........................................................ H03F 3/45
(Continued)

(56) References Cited

U.S. PATENT DOCUMENTS

| 9,880,148 | B1 | 1/2018 | Troxler |
| 2017/0230019 | A1 | 8/2017 | Chandrakumar et al. |
| 2019/0150882 | A1 | 5/2019 | Maharbiz et al. |

FOREIGN PATENT DOCUMENTS

WO    2019035876 A1    2/2019

OTHER PUBLICATIONS

International Search Report and Written Opinion issued Oct. 15, 2021.
(Continued)

*Primary Examiner* — Henry Choe
(74) *Attorney, Agent, or Firm* — DINSMORE & SHOHL LLP

(57) ABSTRACT

A front-end device is arranged to amplify an electric signal from an associated sensor, e.g. for amplifying an electric signal from a neural activity sensor. The front-end device has an amplifier circuit connected between its input and output terminals (Vin, Vout), wherein the amplifier circuit comprises a capacitive-coupled chopper circuit comprising a first gain element and first, second and third chopper switches arranged for operating at a chopper frequency. Further, the amplifier circuit has A) an impedance boosting auxiliary path connected to the input terminal in parallel with a first chopper switch of the CCC, wherein the impedance boosting auxiliary path comprises a pre-charging buffer, and B) a second gain element connected in a feedback path of the CCC. Such front-end device has high input impedance, and the input impedance is uncorrelated with the gain. It is highly suited for implantable micro devices, e.g. brain dusts.

19 Claims, 5 Drawing Sheets

(51) Int. Cl.
*H03F 3/387* (2006.01)
*A61B 5/00* (2006.01)
*A61B 5/279* (2021.01)

(52) U.S. Cl.
CPC .. *H03F 2200/156* (2013.01); *H03F 2200/261* (2013.01); *H03F 2200/375* (2013.01); *H03F 2200/42* (2013.01)

(58) Field of Classification Search
USPC .......................................................... 330/9
See application file for complete search history.

(56) References Cited

OTHER PUBLICATIONS

Samiei et al. A Chopper Stabilized, Current Feedback, Neural Recording Amplifier. IEEE Solid State Circuits Lett. Mar. 2019;2(3):17-20. doi: 10.1109/Issc.2019.2916754.
Seo et al. Neural Dust: An Ultrasonic, Low Power Solution for Chronic Brain-Machine Interfaces. 2013. arXiv:1307.2196 pp. 1-11.
Zamani et al. A 2.3-μW Capacitively Coupled Chopper-Stabilized Neural Amplifier With Input Impedance of 6.7 GΩ. IEEE Solid-State Circuits Letters, vol. 4, Jul. 2, 2021, pp. 133-136. DOI:10.1109/LSSC.2021.3094237.

HIGH IMPEDANCE AND COMPACT NEURAL SENSOR FRONT-END

CROSS-REFERENCE TO RELATED APPLICATIONS

This application is the U.S. National Stage of PCT/EP2021/074101 filed on Sep. 1, 2021, which claims priority to European Patent Application 20193853.7 filed on Sep. 1, 2020, the entire content of both are incorporated herein by reference in their entirety.

FIELD OF THE INVENTION

The present invention relates to the field of instrumentation amplifiers, specifically for biomedical applications. More specifically, the invention provides a high impedance front-end device for a neural sensor suitable for integration into a micro device for implantation into biological tissue, e.g. the brain, such as a so-called brain dust.

BACKGROUND OF THE INVENTION

Micro devices suitable for implanting into biological tissue are typically electrically powered with one or more sensors and/or one or more actuators, and typically such micro devices provide data communication with an external device. However, all of these functions need to packed into the very compact dimensions of the micro device, e.g. the so-called dusts for implantation into brain tissue. For micro devices with a sensor for neural recording, sensing (LFP) neural signals, there is a need for an efficient way of communicating such signals to an external receiver, e.g. in case of a brain dust to implement a brain-computer interface, where tenths or hundreds of implanted micro devices are required to communicate real-time or near real-time LFP signals.

Instrumentation amplifier circuits for such biomedical applications (such as neural recording) experience a large dc offset that appears at the recording electrodes due to the electrochemical effects at the electrode-tissue interface. The input impedance of instrumentation amplifier needs to be large enough to minimize the DC current at the tissue interface due to this large dc offset and reduce the effect of electrodes mismatch.

This is a problem with existing micro devices, e.g. brain dusts, since a very high electrical impedance combined with the ultra compact dimensions required for integration into the micro device, and further this is combined with the demand of a small power consumption due to the limited power available in an implanted micro device.

SUMMARY OF THE INVENTION

Following the above, it may be seen as an object of the present invention to provide an instrumentation amplifier circuit with an input impedance high enough to allow for biomedical applications, preferably suitable for implementation with miniature components suitable for integration into an implantable micro device, such as a brain dust.

In a first aspect, the invention provides a front-end device arranged to amplify an electric signal from an associated sensor, the front-end device comprising
  an input terminal arranged for electric connection to the sensor so as to receive an electric signal from the sensor,
  an output terminal arranged to output an amplified electric signal, and
  an amplifier circuit connected between the input and output terminals, wherein the amplifier circuit comprises a capacitive-coupled chopper circuit (CCC) comprising a first gain element and first, second and third chopper switches for operating at a chopper frequency, wherein the amplifier circuit further comprises
  an impedance boosting auxiliary path connected to the input terminal in parallel with a first chopper switch of the CCC, wherein the impedance boosting auxiliary path comprises a pre-charging buffer, and
  a second gain element connected in a feedback path of the CCC.

Such front-end device is advantageous, since it provides a high impedance compared to traditional instrumentation amplifier designs. Due to the auxiliary path for impedance boosting and the feedback path with a gain element, it is obtained that adjustment of the desired gain of the front-end and its input impedance are uncorrelated to each other. By decreasing the input capacitor, the input impedance will be increased, and the added feedback path can keep the gain constant without decreasing the feedback capacitor (which has its minimum value limited by the technology used for implementation). Furthermore, the proposed structure mitigates the buffer time-constant constraint (in the auxiliary path) since by decreasing the input capacitor, the buffer charges a smaller input capacitor. Moreover, the lower area is a valuable feature of the proposed structure since the input capacitor takes a large portion of the total chip area in a conventional instrumentation amplifier.

Thus, the front-end device is highly suited as front-end for neural sensing electrode, e.g. integrated into a micro device, such as a brain dust.

In the following, preferred features and embodiments of the first aspect will be described.

The impedance boosting auxiliary path preferably comprises a series connection of the pre-charging buffer and a chopper switch. Especially, an input of the pre-charging buffer is directly connected to the input terminal, and an output of the pre-charging buffer is connected to an input capacitor of the CCC. Especially, the chopper switch of the impedance boosting auxiliary path is operated at the same chopper frequency as the first, second and third chopper switches of the CCC.

Preferably, the first chopper switch of the CCC is connected between the input terminal and a first terminal of the input capacitor,
  wherein a second terminal of the input capacitor is connected to a series connection of the first gain element and a first terminal of the second chopper switch, and wherein a second terminal of the second chopper switch is connected to the output terminal. Especially, the second terminal of the input capacitor may be connected to a feedback path comprising a series connection of a feedback capacitor, the third chopper switch and the second gain element. Especially, an input terminal of the second gain element may be connected to the output terminal. Especially, an output terminal of the second gain element may be connected to the third chopper switch.

Preferably, a gain of the second gain element and a capacitance value of input capacitor are selected to provide a target voltage gain of the front-end device.

Preferably, the second gain element has a gain of less than unity, such as a gain of 0.5-0.9, such as a gain of less than 0.5, such as a gain of 0.1-0.5. Especially, the second gain element may have a gain of less than 0.99, such as a gain of less than 0.9, such as a gain of 0.1-0.9, such as a gain of 0.2-0.8.

Especially, the front-end device may comprise auxiliary path pre-charge and gain revision circuits.

Especially, the front-end device may be implemented in CMOS technology occupying an area of less than 0.5 mm$^2$, such as less than 0.2 mm$^2$, such as less than 0.1 mm$^2$.

Preferably, the front-end device is implemented to have a DC input impedance of at least 1 G$\Omega$, such as at least 2 G$\Omega$, such as at least 5 G$\Omega$.

In preferred implementations for integration into micro devices, the front-end device is implemented on one single chip.

In a second aspect, the invention provides a neural sensor system comprising
  a front-end device according to the first aspect, and
  a neural sensor, such as an LFP sensor or a single cell sensor, arranged for implantation into biological tissue, wherein the neural sensor comprises a first part arranged to sense neural electric signals and a second part arranged for connection to the input terminal of the front-end device.

In some embodiments, the neural sensor system comprises a neural recording unit connected to the output terminal of the front-end device, wherein the neural recording unit is arranged to record a time sequence of an electric signal generated at the output terminal of the front-end device. Such recording and storing of a time sequence of sensor signal data can be used for further data processing, and/or for transmitting of sensor signal data in a time compressed format, in case the data transmission capacity allow to do so.

In a third aspect, the invention provides a micro device, such as a brain dust, arranged for implantation into biological tissue, comprising
  a neural sensor system according to the second aspect, and
  a wireless transmitter arranged to transmit a wireless signal with neural activity data generated in response to an electric signal at the output terminal (Vout) of the front-end device, such as an ultrasonic transmitter arranged to transmit an ultrasonic signal with said neural activity data to an external receiver, such as by means of ultrasonic backscattering.

Especially, the micro device may comprise a processor arranged to execute a data processing algorithm in response to the electric signal at the output terminal of the front-end device, and to generate the neural activity data accordingly, such as a data processing algorithm arranged to generate event based neural activity data accordingly. If the processing power is available in the micro device to derive event-based neural activity data, this may help to significantly decrease the amount of data necessary to transmit from the micro device. This will help to reduce power consumption in the micro device, and in a brain dust system with tenth or hundreds of brain dusts, the demands for the total amount of data capacity to handle data from all brain dusts is thereby reduced.

The micro device may have a total volume of less than 1 mm$^3$, such as less than 0.5 mm$^3$, such as less than 0.2 mm$^3$. A micro device has been tested with a piezoelectric ultrasound power receiver and with a blue and a red LED, and with dimensions 500×500×500 µm, i.e. with a volume of 0.125 mm$^3$.

In an advantageous embodiment of the invention, the size of the micro device is small, and for implantation purposes, it may be preferred that the micro device is as small as possible. In preferred embodiment, the dimensions of the micro device is within 1×1×1 mm (height×length×width), such as within 500×500×500 µm, such as within 400×400×400 µm, such as within 300×300×300 µm, such as within 200×200×200 µm and in some embodiments it may be seen as most preferably to be within 100×100×100 µm. It is to be understood that the micro device may preferably be even smaller than 100×100×100 µm in case the actual manufacturing technologies chosen allows to.

In preferred embodiments, the micro device has a total volume of less than 2 mm$^3$, preferably less than 1 mm$^3$, preferably less than 0.7 mm$^3$, such as less than 0.5 mm$^3$.

In some embodiments, the micro device have non-uniform height, length and width. Especially, the height, length, and width dimensions may be such as 200×150×100 µm, or such as 150×150×100 µm, or such as the micro device having a height within 0.5-1.5 mm, a length of 0.5-1.0 mm, and a width of 0.3-0.7 mm.

In some embodiments, the signal receiver system comprises an ultrasonic transmitter system arranged to transmit an ultrasonic signal to an ultrasonic receiver, and wherein the ultrasonic transmitter is arranged to transmit said ultrasonic signal as a backscattered ultrasonic signal to an ultrasonic detector system. Such embodiments preferably utilizes a combination of ultrasound power transmission to the electronics in the micro device, and at the same time allow use of back scattered ultrasonic signals as communication to the external signal receiver system. E.g. such system comprises a piezoelectric crystal connected to a power management circuit for harvesting power from an external ultrasonic receiver and to output electric power for powering circuits of the micro device. Especially, such ultrasonic receiver may be arranged to generate an ultrasonic signal with a frequency in the range of a few MHz or higher.

In a fourth aspect, the invention provides a method for sensing neural activity in biological tissue, the method comprising
  receiving an electric signal from a neural sensor implanted in biological tissue,
  applying said electric signal to an amplifier circuit comprising a capacitive-coupled chopper circuit (CCC) comprising a first gain element and first, second and third chopper switches arranged for operating at a chopper frequency, wherein the amplifier circuit further comprises an impedance boosting auxiliary path connected to receive the said electric signal in parallel with a first chopper switch of the CCC, wherein the impedance boosting auxiliary path comprises a pre-charging buffer, and wherein the amplifier circuit further comprises a second gain element connected in a feedback path of the CCC,
  receiving an output electric signal from said amplifier circuit,
  a applying a signal processing algorithm on said output electric signal, and
  generating an output in response to said signal processing algorithm.

In a fifth aspect, the invention provides use of the front-end device of the first aspect, the neural sensing system of the second aspect, or the micro device of the third aspect for treatment or therapy of a living person or animal.

The same advantageous mentioned for the first aspect apply for the second, third and fourth aspects as well. The individual aspects of the present invention may each be combined with any of the other aspects. These and other aspects of the invention will be apparent from the following description with reference to the described embodiments.

BRIEF DESCRIPTION OF THE FIGURES

The invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Figure 1:
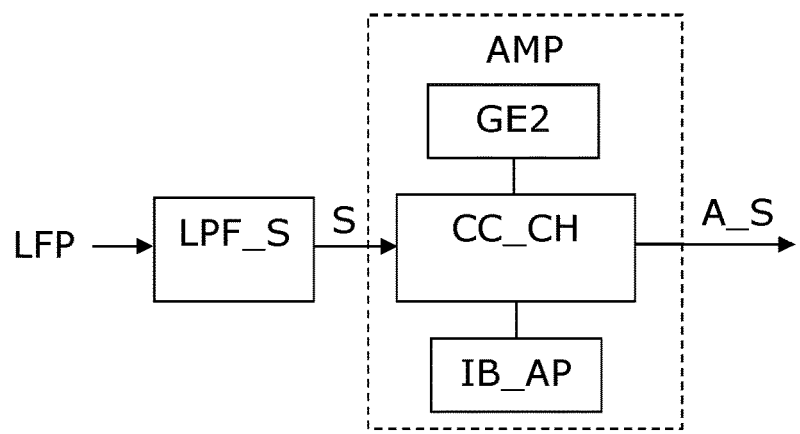
FIG. 1 illustrates a block diagram of a front-end embodiment.

FIG. 1 illustrates a block diagram of basic part of a front-end device embodiment. The front-end device has an amplifier circuit AMP with an input terminal arranged for electric connection to an LFP sensor LFP_S so as to receive an electric signal S from the sensor LFP_S, and an output terminal for outputting an amplified electric signal A_S. The LFP sensor LFP_S has one or more electrodes arranged to sense an LFP signal in a biological tissue, e.g. brain tissue, e.g. cause by neural activity.

The amplifier circuit AMP connected between the input and output terminals has a capacitive-coupled chopper circuit CC_CH with a gain element and chopper switches arranged for operating at a chopper frequency. The amplifier AMP has an impedance boosting auxiliary path IB_AP with a pre-charging buffer connected to the input terminal (Vin) in parallel with a first chopper switch of the chopper circuit CC_CH. Further, the amplifier AMP has a second gain element GE2 which is connected in a feedback path of the chopper circuit CC_CH.

This provides a front-end device with a high electric input impedance, and wherein the input impedance and gain are uncorrelated. At the same time, the amplifier circuit AMP can be implemented with small components, thus occupying only a limited volume. Therefore, the front-end device is suitable for integration into micro devices, such as brain dusts or the like, requiring a high input impedance for electrodes located in biological tissue.

Figure 2A:
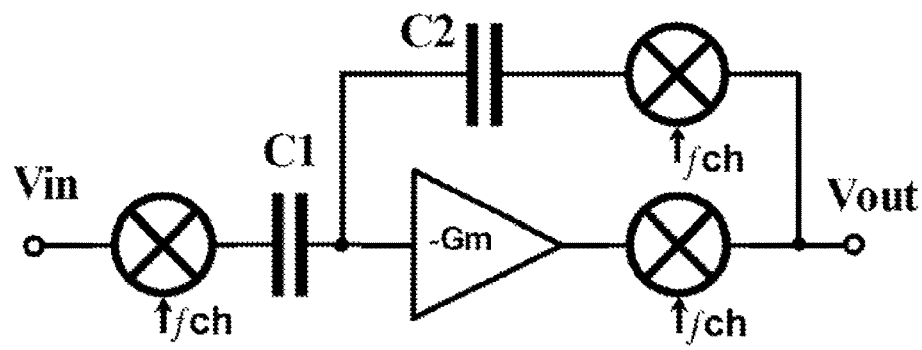
FIG. 2a and FIG. 2b illustrate prior art circuits.

FIG. 2a illustrates a prior art Capacitive-coupled Chopper-stabilizer Instrumentation Amplifier (CCIA). CCIAs are the most commonly used circuits in neural recording amplifiers due to their accurate gain definition (by the ratio of capacitors), and their high input impedance at low frequencies. The CCIA utilizes the chopping technique to decrease the flicker noise at low-frequency range, and remove DC offset. In spite of the low input-referred noise feature of the CCIA, it suffers from low input impedance at DC. The input impedance of a basic CCIA is given by:

$$R_{in} = \frac{1}{f_{ch}C_1}$$

Where $f_{ch}$ and $C_1$ describe the chopper frequency and capacitor, respectively. To remove the flicker noise, a high chopper frequency range is preferred and so causes the intrinsic input impedance of switch-cap combination to be very low (in range of tens of k$\Omega$). The gain of a basic CCIA is the ratio of the feedforward input capacitor to the feedback capacitor. By decreasing the input capacitor, the input impedance can be increased. However, the minimum capacitor defined by technology confines the feedback capacitor and so the input capacitor (which is defined by the gain) and so the input impedance. Another important issue is the Common Mode Rejection Ratio (CMRR), which depends on the matching of the input branches. The mismatch between electrodes may saturate the front-end when the gain is high. To minimize the issue of mismatch, the input impedance of the front-end must be an order of magnitude larger than the electrode impedance.

Figure 2B:
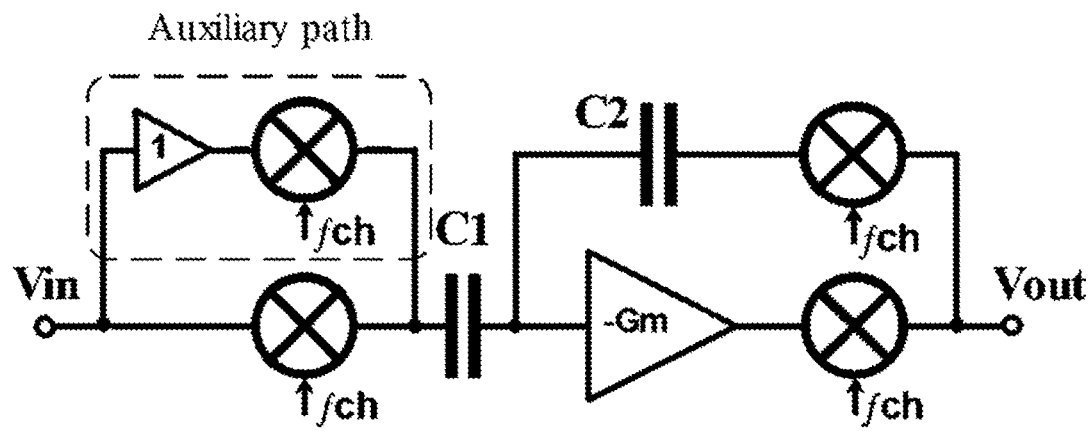

FIG. 2b shows an alternative prior art CCIA circuit, where an impedance boosting approach is using an auxiliary path, which utilizes a pre-charging buffer that charges the input capacitor voltage from its supply voltage without draining current from the input electrodes. The gain and the input impedance of the amplifier is defined as:

$$\text{Gain} = \frac{C_1}{C_2}, \; R_{in} \approx \frac{e^{T/\tau}}{2f_{ch}C_1}$$

Where $C_1$, $C_2$, T, $\tau$, and $f_{ch}$ describe the input capacitor, the feedback capacitor, auxiliary-path chopper on-time duration, buffer time constant, and chopper frequency respectively.

The input impedance is upper bounded by the minimum input capacitor, where this capacitor is also bounded by the required gain. Due to the gain requirement of neural recording front-end, the input capacitor is relatively large, and so the auxiliary-path buffer has a large time constant. Thus, the buffer cannot fully charge the input capacitor, and so the impedance boosting is limited by the auxiliary path time constant, the input capacitor size, and the gain. Considering these limitations and minimum capacitor defined by the technology, only 25× improvement is anticipated for input impedance in comparison with the basic CCIA.

Figure 3:
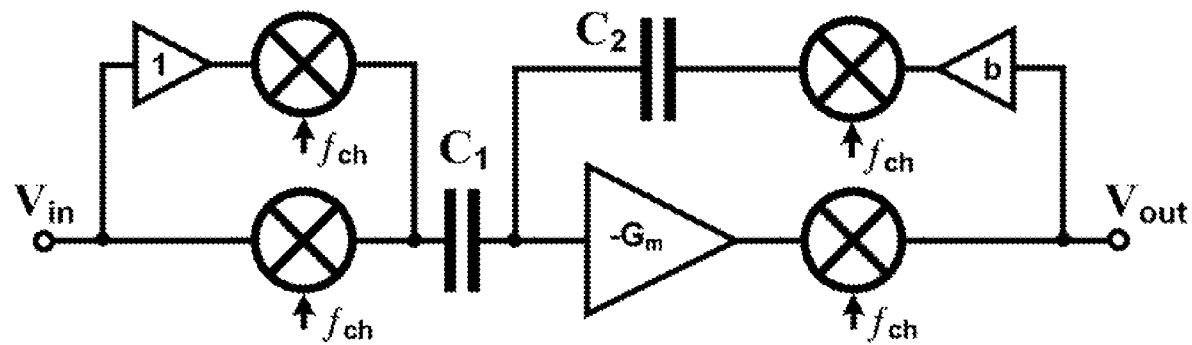
FIG. 3 illustrates a preferred circuit embodiment.

FIG. 3 illustrates an circuit embodiment of the front-end device according to the invention. The proposed structure is the same as the CCIA with the auxiliary path for impedance boosting as in FIG. 2a, however, utilizing a feedback path the gain adjustment and the input impedance become uncorrelated to each other if the ratio of C1 to b is constant. Some can easily show that the gain and the input impedance of the proposed structure is:

$$\text{Gain} = \frac{C_1}{bC_2}, \; R_{in} \approx \frac{e^{T/\tau}}{2f_{ch}C_1}$$

Where $C_1$, $C_2$, b, T, $\tau$, and $f_{ch}$ describe the input capacitor, feedback capacitor, additional block gain, auxiliary path on-time duration, buffer time constant, and chopper frequency, respectively. By decreasing the input capacitor, the input impedance will be increased, and the added feedback path can keep the gain constant without decreasing the feedback capacitor (which its minimum value is limited by the technology). Furthermore, the proposed structure mitigates the buffer time constant constraint since by decreasing the input capacitor, the buffer charges a smaller input capacitor. Moreover, the lower area is a valuable feature of the proposed structure since the input capacitor takes a large portion of the total chip area in a conventional CCIA.

Figure 4:
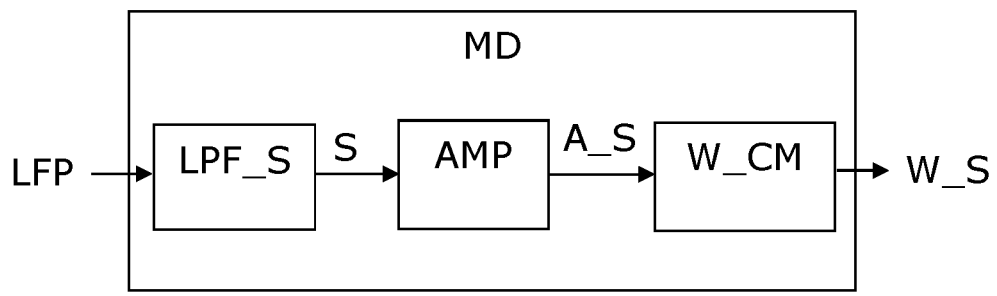
FIG. 4 illustrates a block diagram of a micro device embodiment for implantation into biological tissue, such as a brain dust.

FIG. 4 illustrates a block diagram of an implantable micro device MD, e.g. a brain dust, with including a neural sensing system in the form of an LFP sensor LFP_S and the amplifier circuit AMP described in the forgoing, which is arranged to receive an electric output S from the sensor LFP_S and generate an amplified signal A_S accordingly. The micro device MD further has a wireless communication unit W_CM which receives the amplified signal A_S and is capable of transmitting data indicative of a sensed neural activity by means of the sensor LPF_S in a wireless signal W_S to be received by an external receiver. E.g. the wireless signal is in the form of an ultrasonic signal and/or an electromagnetic Radio Frequency signal. Specifically, the micro device may comprise a piezoelectric crystal for harvesting power from an external ultrasonic transmitter, and wherein the piezoelectric crystal is utilized for transmitting the wireless signal W_S as an ultrasonic backscattering signal to be received by an external ultrasonic receiver.

Figure 5:
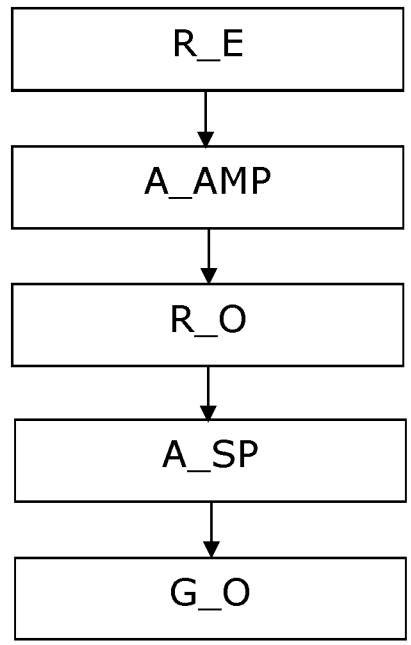
FIG. 5 illustrates steps of a method embodiment.

FIG. 5 illustrates steps of an embodiment of a method for sensing neural activity in biological tissue. First, receiving R_E an electric signal from a neural sensor implanted in biological tissue, next applying A_AMP said electric signal to an amplifier circuit comprising a capacitive-coupled chopper circuit (CCC) comprising a first gain element and first, second and third chopper switches arranged for operating at a chopper frequency, wherein the amplifier circuit further comprises an impedance boosting auxiliary path connected to receive the said electric signal in parallel with a first chopper switch of the CCC, wherein the impedance boosting auxiliary path comprises a pre-charging buffer, and wherein the amplifier circuit further comprises a second gain element connected in a feedback path of the CCC. Next, receiving R_O an output electric signal from said amplifier circuit, next, applying A_SP a signal processing algorithm on said output electric signal, and generating G_O an output in response to said signal processing algorithm.

Figure 6:
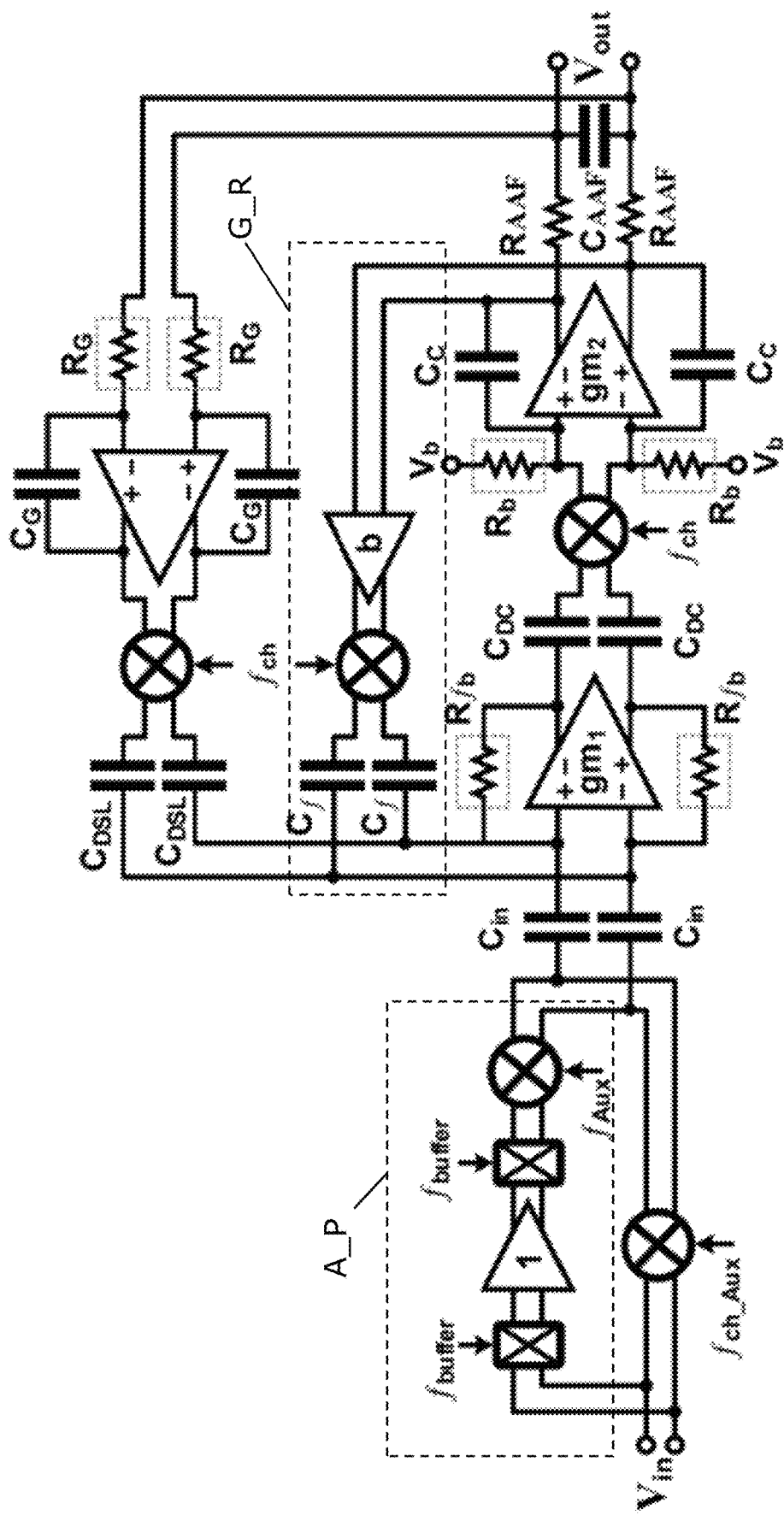
FIG. 6 illustrates a specific front-end embodiment which has been implemented and tested.

FIG. 6 illustrates a specific front-end embodiment with auxiliary path precharge and gain revision techniques. The front-end embodiment has been implemented in 180 nm CMOS technology occupying an area of 0.051 mm² and having a power consumption of 2.1 µW drawn from a 1 V supply. A DC input impedance of 6.7 GΩ is obtained, thereby meeting the requirements of an implantable multi-channel recording system. A Common Mode Rejection Ratio is −75 dB is obtained, and the input-referred noise is 2.1 $\mu V_{rms}$. The front-end embodiment has been tested with neural signals recorded in vitro from a mouse brain slice.

Figure 7A:
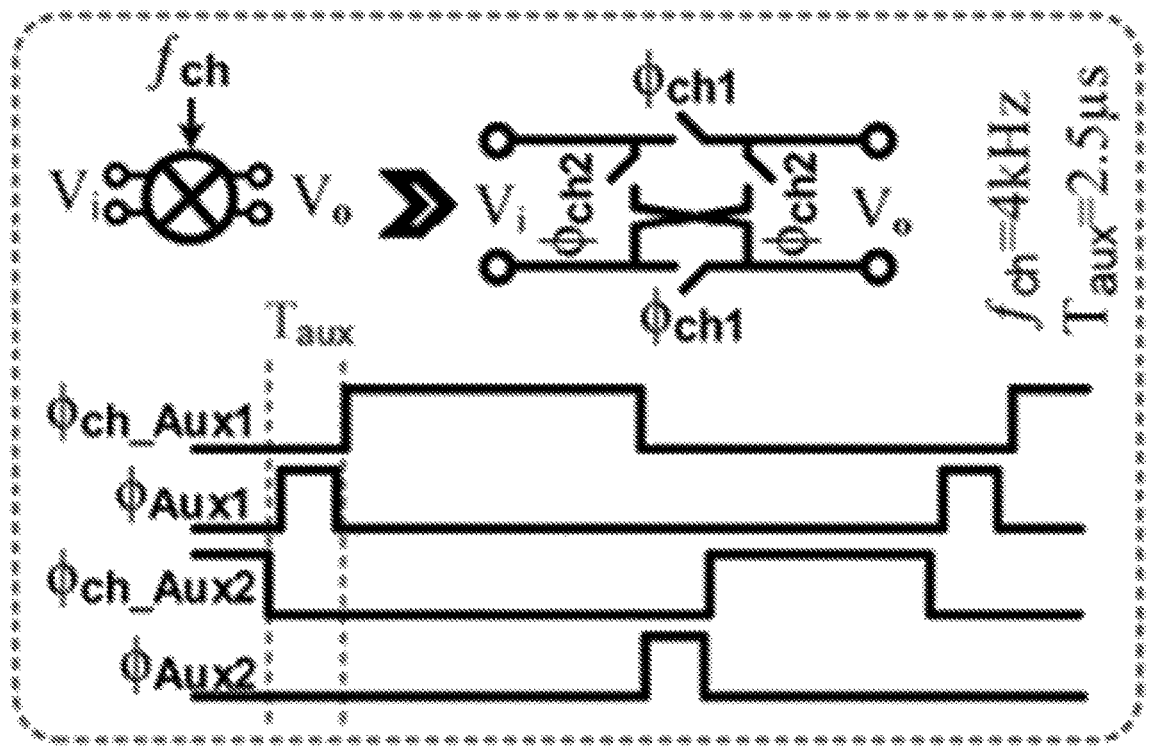
FIG. 7A, 7B illustrate specific details of the embodiment of FIG. 6.

FIG. 7A illustrates a specific implementation of the auxiliary path A_P of the embodiment of FIG. 6 with a chopper frequency of 4 kHz, and a delay of T_aux between the chopper signals f ch_Aux and f Aux of 2.5 µs.

Figure 7B:
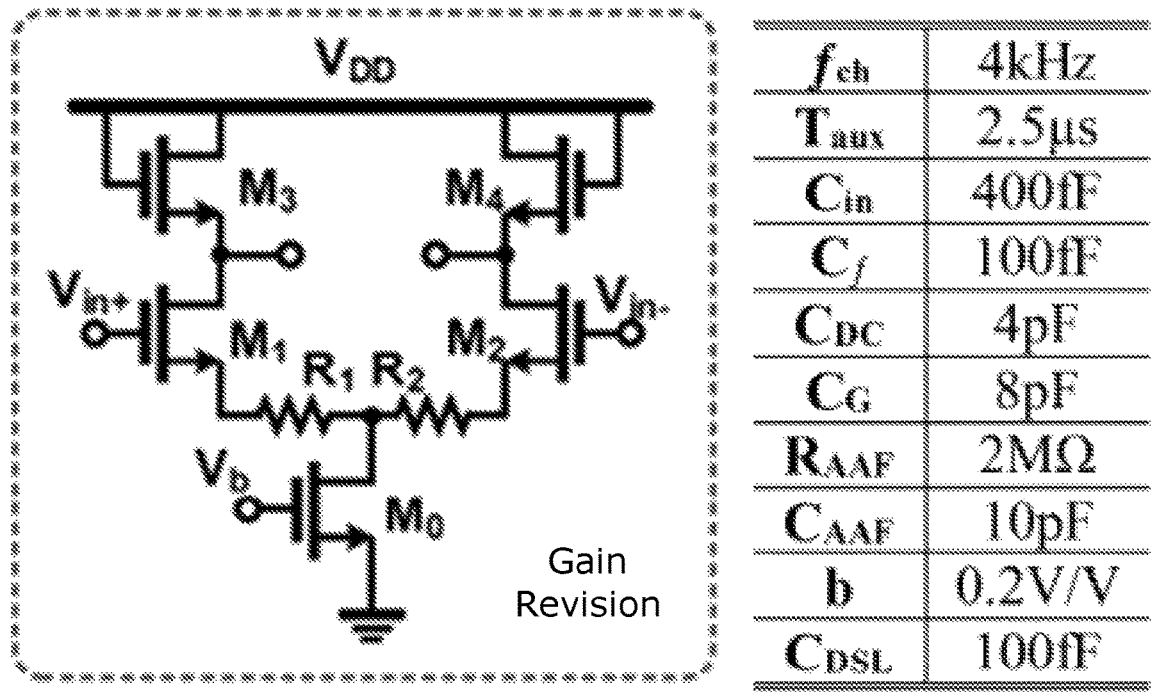

FIG. 7B illustrates a specific implementation of the gain revision G_R part of the embodiment of FIG. 6.

Figure 8:
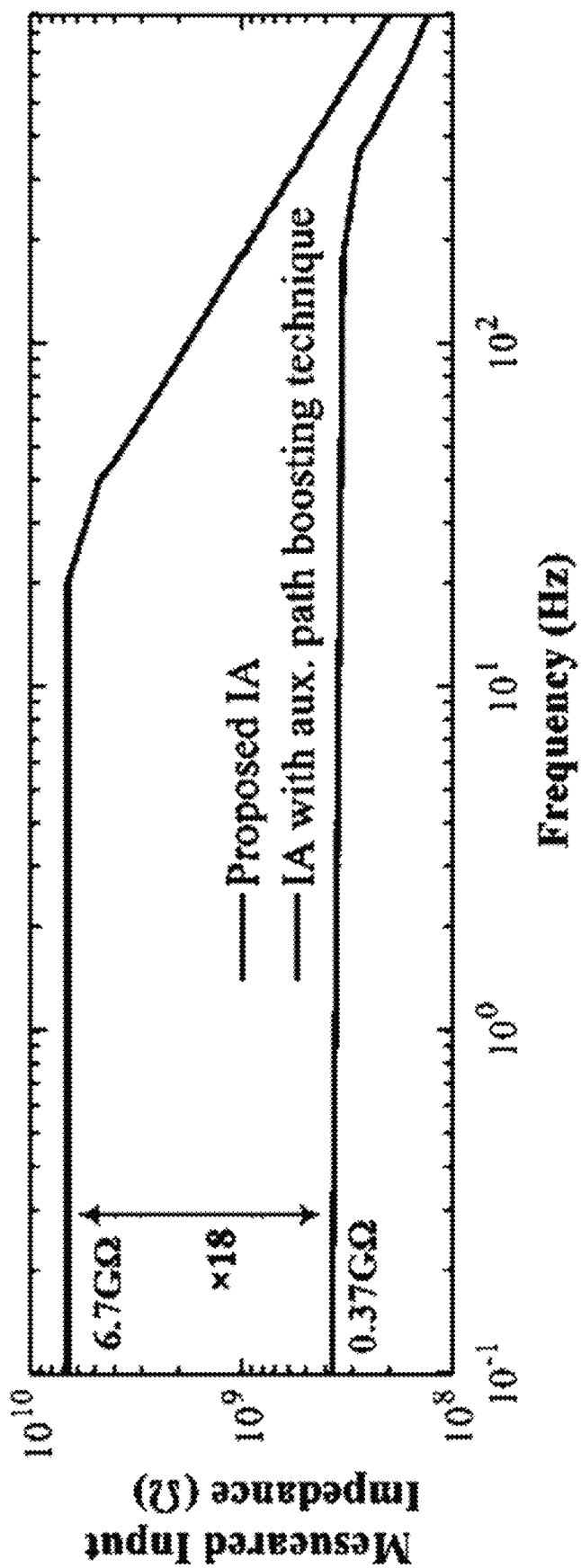
FIG. 8 illustrates a graph with measured input impedance of the embodiment shown in FIG. 6 compared with a conventional auxiliary path impedance boosting technique.

FIG. 8 illustrates a graph of the measured input impedance of the proposed embodiment of FIG. 6, 7A, 7B with gain revision technique, compared to a conventional auxiliary path boosting technique without gain revision. As seen, there is a factor of 18 in difference at DC, and at DC the embodiment of FIG. 6, 7A, 7B obtains an input impedance of 6.7 GΩ.

To sum up, the invention provides a front-end device arranged to amplify an electric signal from an associated sensor, e.g. for amplifying an electric signal from a neural activity sensor. The front-end device has an amplifier circuit connected between its input and output terminals (Vin, Vout), wherein the amplifier circuit comprises a capacitive-coupled chopper circuit (CCC) comprising a first gain element (−Gm) and first, second and third chopper switches (CH1, CH2, CH3) arranged for operating at a chopper frequency ($f_{ch}$). Further, the amplifier circuit has A) an impedance boosting auxiliary path connected to the input terminal (Vin) in parallel with a first chopper switch (CH1) of the CCC, wherein the impedance boosting auxiliary path comprises a pre-charging buffer (1), and B) a second gain element (b) connected in a feedback path of the CCC. Such front-end device has high input impedance, and the input impedance is uncorrelated with the gain. It is highly suited for implantable micro devices, e.g. brain dusts.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A front-end device arranged to amplify an electric signal from an associated sensor, the front-end device comprising
    an input terminal arranged for electric connection to the sensor so as to receive an electric signal from the sensor;
    an output terminal arranged to output an amplified electric signal; and
    an amplifier circuit connected between the input and output terminals, wherein the amplifier circuit comprises a capacitive-coupled chopper circuit comprising a first gain element and first, second and third chopper switches arranged for operating at a chopper frequency (fch), wherein the amplifier circuit further comprises;
        an impedance boosting auxiliary path connected to the input terminal (Vin) in parallel with a first chopper switch of the CCC, wherein the impedance boosting auxiliary path comprises a pre-charging buffer, and
        a second gain element connected in a feedback path of the CCC.

2. The front-end device according to claim 1, wherein said impedance boosting auxiliary path comprises a series connection of the pre-charging buffer and a chopper switch.

3. The front-end device according to claim 2, wherein an input of the pre-charging buffer is directly connected to the input terminal, and an output of the pre-charging buffer is connected to an input capacitor of the CCC.

4. The front-end device according to claim 2, wherein said chopper switch of the impedance boosting auxiliary path is operated at the same chopper frequency as the first, second and third chopper switches of the CCC.

5. The front-end device according to claim 1, wherein:
the first chopper switch of the CCC is connected between the input terminal and a first terminal of the input capacitor;
a second terminal of the input capacitor is connected to a series connection of the first gain element and a first terminal of the second chopper switch; and
a second terminal of the second chopper switch is connected to the output terminal.

6. The front-end device according to claim 5, wherein the second terminal of the input capacitor is connected to a feedback path comprising a series connection of a feedback capacitor, the third chopper switch and the second gain element.

7. The front-end device according to claim 6, wherein an input terminal of the second gain element (b) is connected to the output terminal.

8. The front-end device according to claim 6, wherein an output terminal of the second gain element is connected to the third chopper switch.

9. The front-end device according to claim 1, wherein a gain of the second gain element and a capacitance value of input capacitor are selected to provide a target voltage gain of the front-end device.

10. The front-end device according to claim 1, wherein the second gain element has a gain of less than unity, such as a gain of less than 0.99, such as a gain of less than 0.9, such as a gain of 0.1-0.9, such as a gain of 0.2-0.8.

11. The front-end device according to claim 1, comprising auxiliary path pre-charge and gain revision circuits.

12. The front-end device according to claim 1, implemented in CMOS technology occupying an area of less than 0.5 mm$^2$, such as less than 0.2 mm$^2$, such as less than 0.1 mm$^2$.

13. The front-end device according to claim 1, having a DC input impedance of at least 1 GΩ, such as at least 2 GΩ, such as at least 5 GΩ.

14. A neural sensor system comprising:
a front-end device according to claim 1, and
a neural sensor arranged for implantation into biological tissue, wherein the neural sensor comprises a first part arranged to sense neural electric signals and a second part arranged for connection to the input terminal (Vin) of the front-end device.

15. The neural sensor system according to claim 14, comprising a neural recording unit connected to the output terminal of the front-end device, wherein the neural recording unit is arranged to record a time sequence of an electric signal generated at the output terminal (Vout) of the front-end device.

16. A micro device arranged for implantation into biological tissue, comprising
a neural sensor system according to claim 14; and
a wireless transmitter arranged to transmit a wireless signal with neural activity data generated in response to an electric signal at the output terminal (Vout) of the front-end device.

17. The micro device according to claim 16, comprising a processor arranged to execute a data processing algorithm in response to the electric signal at the output terminal (Vout) of the front-end device, and to generate the neural activity data accordingly.

18. The micro device according to claim 16, having a total volume of less than 1 mm$^3$, such as less than 0.5 mm$^3$, such as less than 0.2 mm$^3$.

19. A method for sensing neural activity in biological tissue, the method comprising:
receiving an electric signal from a neural sensor implanted in biological tissue;
applying said electric signal to an amplifier circuit comprising a capacitive-coupled chopper circuit comprising a first gain element and first, second and third chopper switches arranged for operating at a chopper frequency, wherein the amplifier circuit further comprises an impedance boosting auxiliary path connected to receive the said electric signal in parallel with a first chopper switch of the CCC, wherein the impedance boosting auxiliary path comprises a pre-charging buffer, and wherein the amplifier circuit further comprises a second gain element connected in a feedback path of the CCC;
receiving an output electric signal from said amplifier circuit;
applying a signal processing algorithm on said output electric signal; and
generating an output in response to said signal processing algorithm.

* * * * *